(12) United States Patent
Li

(10) Patent No.: US 12,513,930 B2
(45) Date of Patent: Dec. 30, 2025

(54) METHOD FOR IMPROVING BRIDGING BETWEEN SOURCE/DRAIN EPITAXIAL LAYER AND GATE

(71) Applicant: Shanghai Huali Integrated Circuit Corporation, Shanghai (CN)

(72) Inventor: Yong Li, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 557 days.

(21) Appl. No.: 17/953,711

(22) Filed: Sep. 27, 2022

(65) Prior Publication Data

US 2023/0143668 A1    May 11, 2023

(30) Foreign Application Priority Data

Nov. 10, 2021   (CN) .......................... 202111327354.3

(51) Int. Cl.
| | | |
|---|---|---|
| *H10D 64/01* | (2025.01) | |
| *H10D 30/01* | (2025.01) | |
| *H10D 84/01* | (2025.01) | |
| *H10D 84/03* | (2025.01) | |
| *H10D 84/83* | (2025.01) | |

(52) U.S. Cl.
CPC ......... *H10D 30/024* (2025.01); *H10D 64/017* (2025.01); *H10D 84/013* (2025.01); *H10D 84/0158* (2025.01); *H10D 84/038* (2025.01); *H10D 84/834* (2025.01)

(58) Field of Classification Search
CPC .. H10D 30/024; H10D 64/017; H10D 84/013; H10D 84/0158; H10D 84/038; H10D 84/834; H10D 30/797; H10D 62/822; H10D 84/017; H10D 84/0193; H10D 84/0135; H10D 84/0151
See application file for complete search history.

(56) References Cited

U.S. PATENT DOCUMENTS

| | | | | |
|---|---|---|---|---|
| 2008/0185649 | A1* | 8/2008 | Anderson | H10D 30/024 257/E29.264 |
| 2014/0138780 | A1* | 5/2014 | Colinge | H10D 64/017 438/289 |
| 2021/0328020 | A1* | 10/2021 | Chung | H10D 62/822 |

* cited by examiner

*Primary Examiner* — William B Partridge
*Assistant Examiner* — Erik A. Anderson
(74) *Attorney, Agent, or Firm* — Banner & Witcoff, Ltd.

(57) ABSTRACT

The present application relates to a method for improving the bridging defects between a source/drain epitaxial layer and a gate, and relates to a semiconductor integrated circuit technology. By adding a process of etching an insulating layer between lower portions of fins after an etching process of forming a polysilicon gate row, then forming sidewalls and a hard mask layer, and then forming a source/drain epitaxial layer, due to the added process of etching the insulating layer between the lower portions of the fins, holes located under the epitaxial layer and the polysilicon gate are therefore isolated, avoiding bridging defects between the polysilicon of the gate structure and the source/drain epitaxial layer, thus improving the performance of the device.

10 Claims, 5 Drawing Sheets dummy gate 230 dummy gate 230

METHOD FOR IMPROVING BRIDGING BETWEEN SOURCE/DRAIN EPITAXIAL LAYER AND GATE

CROSS-REFERENCES TO RELATED APPLICATIONS

This application claims the priority to Chinese patent application No. CN 202111327354.3, filed on Nov. 10, 2021, and entitled "METHOD FOR IMPROVING BRIDGING BETWEEN SOURCE/DRAIN EPITAXIAL LAYER AND GATE", the disclosure of which is incorporated herein by reference in its entirety.

TECHNICAL FIELD

The present application relates to a semiconductor integrated circuit technology, in particular, to a method for improving bridging defects between a source/drain epitaxial layer and a gate.

BACKGROUND

With continuous development of semiconductor technologies, the sizes of devices have been shrinking. Currently fin field effect transistors have come into being.

The existing fin field effect transistors typically include fins formed on semiconductor substrates. The number of the fins in each of such devices is more than one and the fins are arranged in parallel to each other. The lower parts of the fins are isolated from each other through an insulating layer. The fin field effect transistors typically include polysilicon gates. The number of the polysilicon gates in each of such devices is also more than one and the polysilicon gates are also arranged in parallel to each other. A length direction of each of the polysilicon gates is perpendicular to a length direction of each of the fins. The channels are formed on the surfaces of the fins underneath the polysilicon gates. Then, a metal gate is formed in a formation area of each of the polysilicon gates through a metal replacement process. In addition, the fin field effect transistor may be an N-type fin field effect transistor and a p-type fin field effect transistor. A source region and a drain region are formed on two sides of the metal gate of each of the N-type fin field effect transistors. An embedded silicon phosphorus (SiP) epitaxial layer is formed in the source region and the drain region. For a P-type fin field effect transistor, an embedded silicon germanium (SiGe) epitaxial layer is formed in the source region and the drain region. Different epitaxial layer contours lead to different pressure and device performance. A larger epitaxial layer is conducive for forming the layer of higher strain and lower impedance, however increasing the volume of the epitaxial layer can lead to bridging defects between the epitaxial layer and the gate, thus affecting the performance of the device.

BRIEF SUMMARY

According to some embodiments in this application, a method for mitigating bridging defects between a source/drain epitaxial layer and a gate for a N-type fin field effect transistor or a P-type fin field effect transistor is disclosed to include the following steps: S1: providing a semiconductor substrate, forming a plurality of fins on the semiconductor substrate, the plurality of fins being arranged in parallel, and forming an insulating layer outside of the lower portions of the fins to isolate each fin from each other; S2: forming a polysilicon gate layer and performing an etching process to form a plurality of polysilicon gate rows, the plurality of polysilicon gate rows being arranged in parallel, and a length direction of the plurality of polysilicon gate rows being perpendicular to a length direction of the plurality of fins to respectively form dummy gate structures in intersection areas of the plurality of polysilicon gate rows and the plurality of fins; S3: performing an etching process to the insulating layer between the lower portions of the fins to remove a part of the insulating layer at a first thickness and tain another part of the insulating layer; S4: forming sidewalls, the sidewalls covering exposed surfaces of the fins, a surface of the insulating layer between the fins and surfaces of the polysilicon gate rows; S5: forming a hard mask layer on the sidewalls; S6: forming source regions or drain regions on two sides of each dummy gate structure on the fins, an embedded trench being formed in the source regions or the drain regions; and S7: forming an embedded epitaxial layer in the trench, the embedded epitaxial layer being used as the source/drain epitaxial layer.

In some cases, the insulating layer is formed of a shallow trench field oxide.

In some cases, the embedded epitaxial layer includes an embedded SiGe epitaxial layer for the P-type fin field effect transistor or an embedded SiP epitaxial layer for N-type fin field effect transistor.

In some cases, the embedded SiP epitaxial layer is formed in the source regions or drain regions on two sides of each dummy gate structure of an N-type fin field effect transistor; and the embedded SiGe epitaxial layer is formed in the source regions or drain regions on two sides of each dummy gate structure of a P-type fin field effect transistor.

In some cases, the first thickness h1 is in a range of 2 nm-10 nm.

In some cases, the first thickness h1 is about 5 nm.

In some cases, the sidewalls are formed by adopting a deposition process.

In some cases, the hard mask layer is formed by adopting a deposition process.

In some cases, the trench is formed by adopting an etching process.

In some cases, the trench is an Σ-shaped trench.

DETAILED DESCRIPTION OF THE APPLICATION

Figure 1:
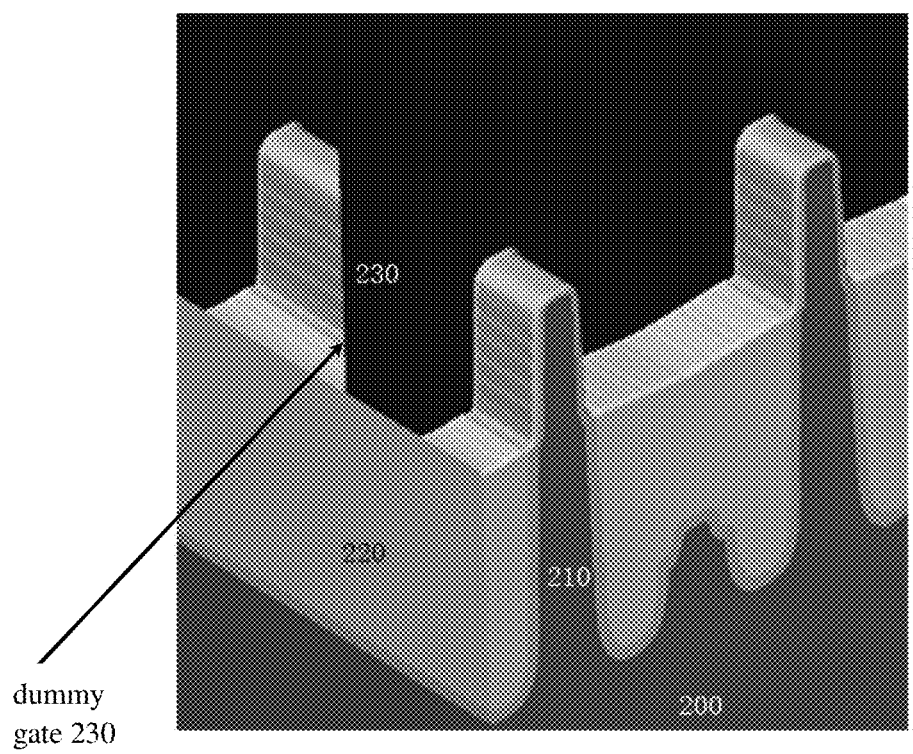
FIG. 1 to FIG. 5 illustrate schematic diagrams of the 3D structures after each step during the process of making a source/drain epitaxial layers of the fin field effect transistor according to an embodiment of the present application.

The technical solution of the present application will be clearly and completely described below with reference to the drawings. Obviously, the described embodiments are part of the embodiments of the present application, not all of them. Based on the embodiments of the present application, all other embodiments obtained by those skilled in the art without contributing any inventive labor still fall within the scope of the present application.

It should be understood that the terms "first", "second" and the like in the claims and description of the present application are used to distinguish different objects, rather than to describe a specific order. The terms "comprise" and "include" used in the description and claims of the present application indicate the existence of the described feature, whole, step, operation, element and/or component, but do not exclude the existence or addition of one or more other features, whole, steps, operations, elements, components and/or a combination thereof.

An embodiment of the present application provides a method for making a fin field effect transistor which mitigates bridging defects between a source/drain epitaxial layer and a gate. The method includes: S1: providing a semiconductor substrate, forming a plurality of fins on the semiconductor substrate, the plurality of fins being arranged in parallel, and forming an insulating layer outside of the lower portions of the fins to isolate each fin from other fins; S2: forming a polysilicon gate layer and performing an etching process to form a plurality of polysilicon gate rows, the plurality of polysilicon gate rows are arranged in parallel to each other, and a length direction of the plurality of polysilicon gate rows is perpendicular to a length direction of the plurality of fins to form dummy gate structures in intersection areas of the plurality of polysilicon gate rows and the plurality of fins respectively; S3: performing an etching process to the insulating layer between the lower portions of the fins to remove a part of the insulating layer at the first thickness, and yet retaining the other part of the insulating layer; S4: forming sidewalls, the sidewalls are disposed on exposed surfaces of the fins as well as a surface of the insulating layer between the fins and surfaces of the polysilicon gate rows; S5: forming a hard mask layer on the sidewalls; S6: forming source regions and drain regions on two sides of each of the dummy gate structures on the fins, forming embedded trenches in the source regions or the drain regions; and S7: forming embedded epitaxial layers in the trenches, the embedded epitaxial layers are source/drain layers.

Specifically, referring to FIG. 1 to FIG. 5, which illustrate schematic diagrams of the 3D structures after each step during the process of making a source/drain epitaxial layer of the fin field effect transistor according to an embodiment of the present application. The method for mitigating bridging defects between the source/drain epitaxial layers and the gates according to the present application includes the following steps:

In step S1, referring to FIG. 1, a semiconductor substrate 200 is provided, a plurality of fins 210 are formed on the semiconductor substrate 200, the plurality of fins 210 are arranged in parallel, and an insulating layer 220 is formed outside of the lower portion of the fins to isolate each fin 210 from others.

In an embodiment of the present application, the material of the semiconductor substrate is the same as the material of the plurality of fins 210, such as silicon, that is, the plurality of fins 210 are formed by a substrate or an epitaxial layer formed on the substrate. In an embodiment of the present application, the plurality of fin bodies 210 is formed by performing photolithography to the semiconductor substrate. In an embodiment of the present application, the insulating layer 220 is usually formed of a shallow trench field oxide.

In step S2, referring to FIG. 1, a polysilicon gate layer is formed and an etching process is performed to form a plurality of polysilicon gate rows 230, the plurality of polysilicon gate rows 230 are arranged in parallel, and a length direction of the plurality of polysilicon gate rows 230 is perpendicular to a length direction of the plurality of fins 210 to respectively form dummy gate structures in intersection areas of the plurality of polysilicon gate rows 230 and the plurality of fins 210.

Figure 2:
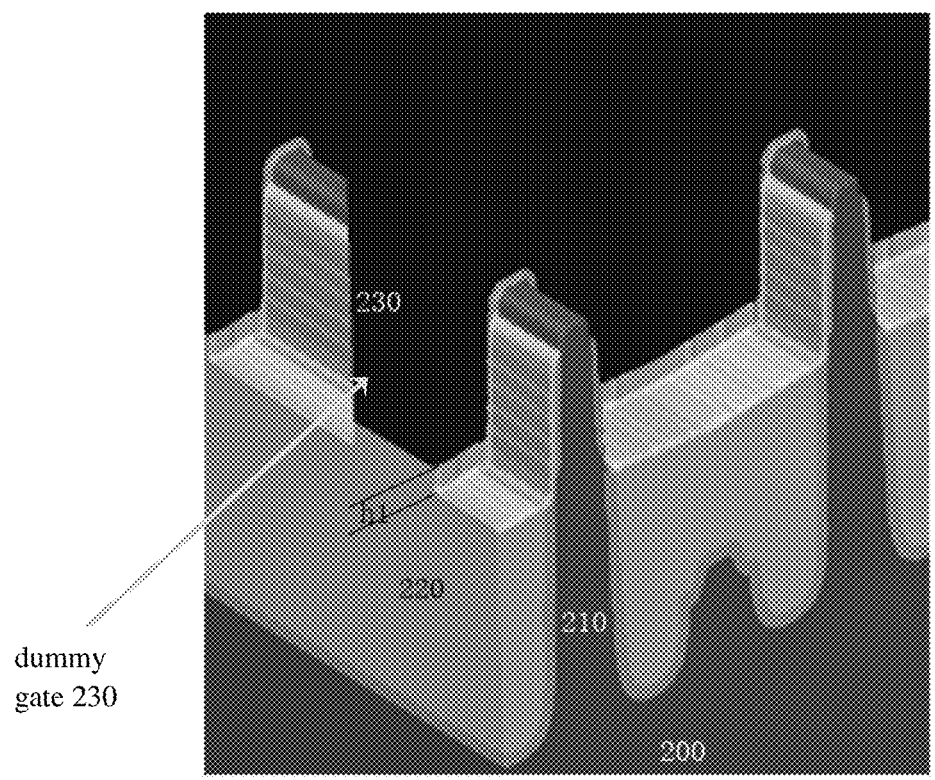

In step S3, referring to FIG. 2, an etching process is performed to the insulating layer 220 between the lower portion of the fins to remove a portion of the insulating layer at the first thickness and keep other parts of the insulating layer.

In an embodiment of the present application, the first thickness h1 is 2 nm-10 nm.

Further, in an embodiment of the present application, the first thickness h1 is about 5 nm.

Figure 3:
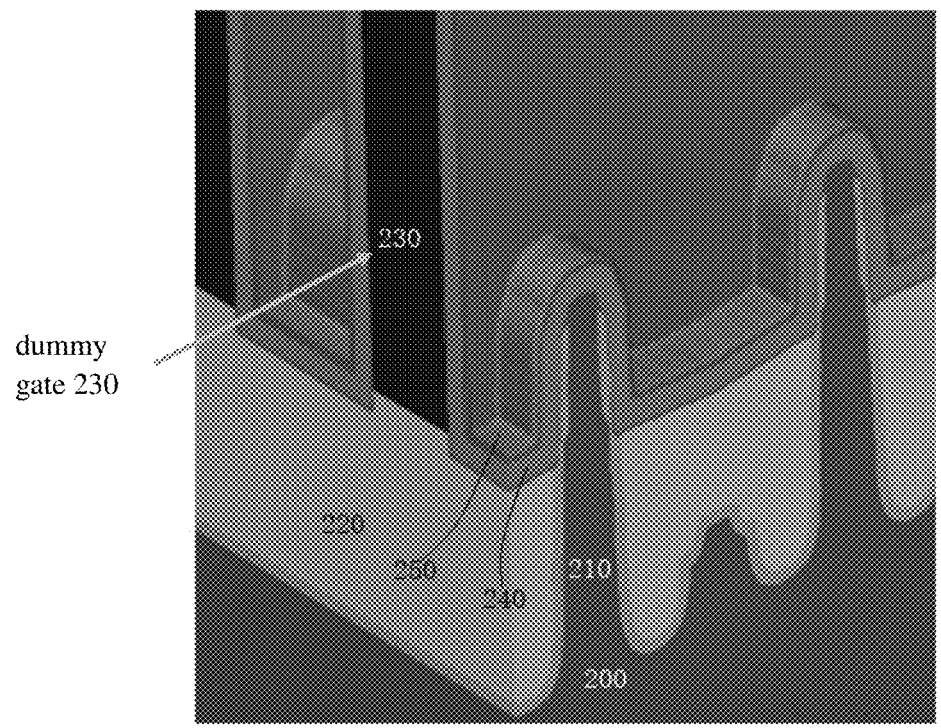

In step S4, referring to FIG. 3, sidewalls 240 are formed. The sidewalls 240 cover exposed surfaces of the fins 210, a surface of the insulating layer 220 between the fins and surfaces of the polysilicon gate rows 230.

In an embodiment of the present application, the sidewalls 240 are formed by adopting a deposition process.

In step S5, referring to FIG. 3, a hard mask layer 250 is formed on the sidewalls 240.

In an embodiment of the present application, the hard mask layer 250 is formed by adopting a deposition process.

Figure 4:
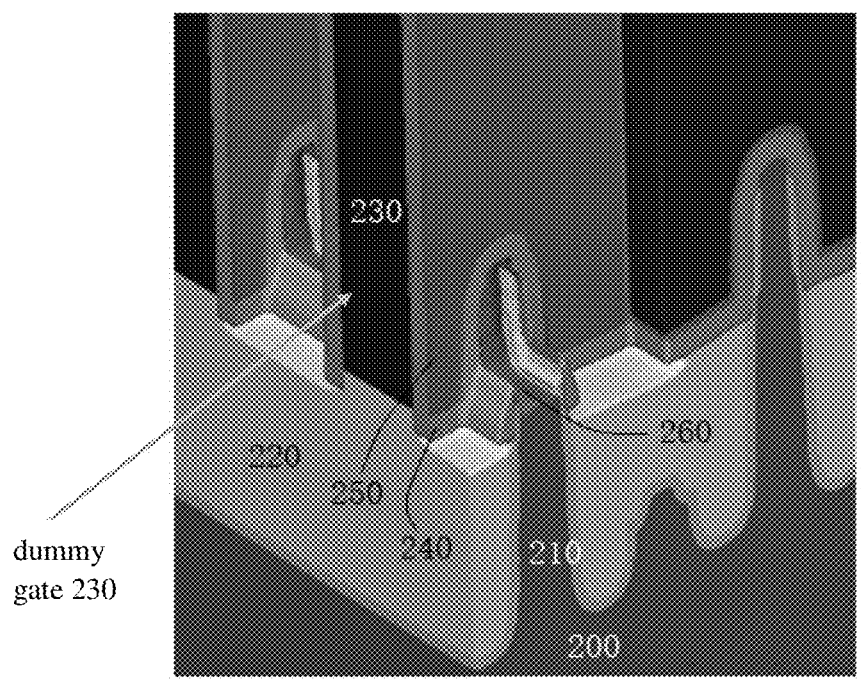

In step S6, referring to FIG. 4, source regions or drain regions are formed on two sides of each dummy gate structure on the fins. An embedded trench 260 is formed in the source regions or the drain regions.

In an embodiment of the present application, the trench 260 is formed by adopting an etching process.

In an embodiment of the present application, the trench 260 is an Σ-shaped trench.

Figure 5:
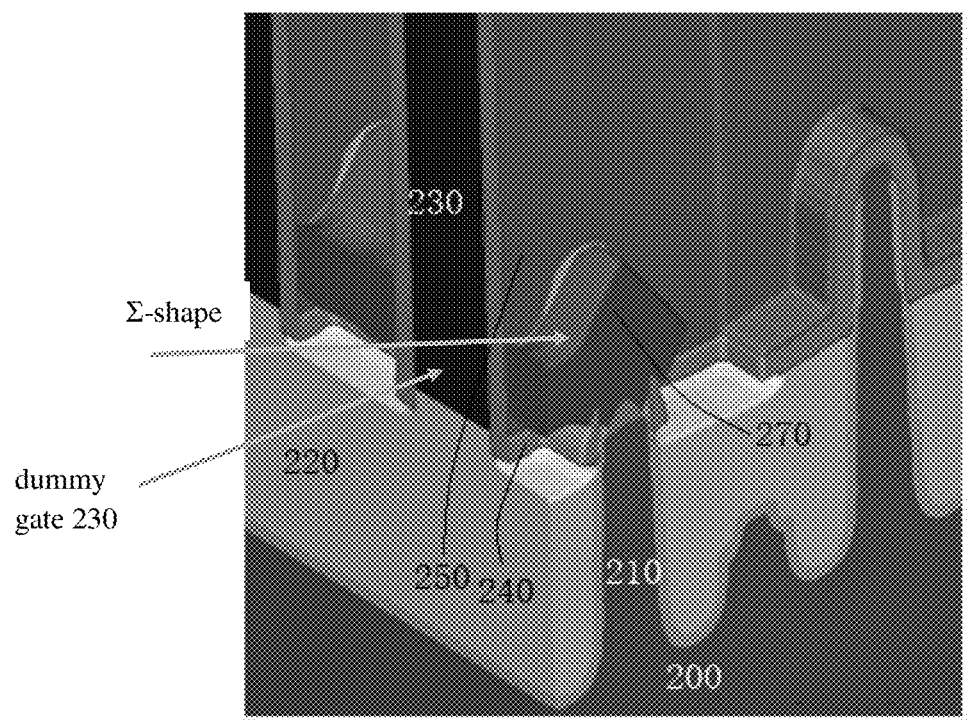

In step S7, referring to FIG. 5, an embedded epitaxial layer is formed in the trench 260. The embedded epitaxial layer 270 is used as the source/drain epitaxial layer.

In an embodiment of the present application, the embedded epitaxial layer is formed by adopting a deposition process.

In an embodiment of the present application, the embedded epitaxial layer includes an embedded SiGe epitaxial layer and an embedded SiP epitaxial layer. The embedded SiP epitaxial layer is formed in the source regions or drain regions on two sides of each dummy gate structure of an N-type fin field effect transistor. The embedded SiGe epitaxial layer is formed in the source regions or drain regions on two sides of each dummy gate structure of a P-type fin field effect transistor.

As described above, by adding a process of etching an insulating layer between bottoms of fins after an etching process of forming a polysilicon gate row, then forming sidewalls and a hard mask layer, and then forming a source/drain epitaxial layer, due to the added process of etching the insulating layer between the lower portion of of the fins, holes located under the epitaxial layer and the polysilicon gate are isolated, which avoids bridge defects between the polysilicon of the gate structure and the source/drain epitaxial layer, thus improving the performance of the devices.

Finally, it should be noted that the disclosed embodiments provide the technical solutions of the present application, rather than limiting them. Although the present application has been described in detail with reference to the embodiments, it should understand that those skilled in the art may make modifications to the technical solutions recorded in the embodiments or make equivalent replacements to part or all of the technical features. However, these modifications or replacements do not make the essence of the corresponding technical solutions go beyond the scope of the technical solutions of the embodiments of the present application.

What is claimed is:

1. A method for improving bridging defects between a source/drain epitaxial layer and a gate of fin field effect transistors, wherein the fin field effect transistors comprise an N-type fin field effect transistor and a P-type fin field effect transistor, wherein the method for both the N-type fin field effect transistor and the P-type fin field effect transistor comprises:

S1: providing a semiconductor substrate, forming a plurality of fins on the semiconductor substrate, and forming an insulating layer on and between lower portions of an adjacent two of the plurality of fins to isolate each fin, leaving top surfaces of the fins exposed, wherein the plurality of fins is arranged in parallel to each other;

S2: forming a polysilicon gate layer, forming, by an etching process, a plurality of polysilicon gate rows, wherein the plurality of polysilicon gate rows is arranged in parallel, wherein a length direction of the plurality of polysilicon gate rows is perpendicular to a length direction of the plurality of fins, wherein an intersecting area of one of the plurality of polysilicon gate rows and one of the plurality of fins constitute a first dummy gate structure;

S3: performing an etching process to remove a portion of the insulating layer between the lower portions of the adjacent two of the plurality of fins, wherein the removed portion of the insulating layer has a first thickness, and to retain another part of the insulating layer on sides of the fins;

S4: forming sidewalls of the fins, wherein the sidewalls are disposed on the exposed top surfaces of the plurality of fins, a surface of the insulating layer on and between the adjacent two of the plurality of fins, and surfaces of the plurality of polysilicon gate rows;

S5: forming a hard mask layer on the sidewalls of the fins;

S6: forming source regions or drain regions on two sides of the first dummy gate structure on the plurality of fins, wherein an embedded trench is formed in the source regions or in the drain regions; and S7: forming an embedded epitaxial layer in the embedded trench of the source regions or the drain regions.

2. The method for improving the bridging defects between the source/drain epitaxial layer and the gate according to claim 1, wherein the insulating layer comprises a trench field oxide.

3. The method for improving the bridging defects between the source/drain epitaxial layer and the gate according to claim 1, wherein the embedded epitaxial layer comprises an embedded SiGe epitaxial layer for the P-type fin field effect transistor or an embedded SiP epitaxial layer for the N-type fin field effect transistor.

4. The method for improving the bridging defects between the source/drain epitaxial layer and the gate according to claim 3, wherein the embedded SiP epitaxial layer is formed in the source regions or drain regions on two sides of a first dummy gate structure of the N-type fin field effect transistor; and wherein the embedded SiGe epitaxial layer is formed in the source regions or drain regions on two sides of a first dummy gate structure of the P-type fin field effect transistor.

5. The method for improving the bridging defects between the source/drain epitaxial layer and the gate according to claim 1, wherein the first thickness is 2 nm-10 nm.

6. The method for improving the bridging defects between the source/drain epitaxial layer and the gate according to claim 5, wherein the first thickness is about 5 nm.

7. The method for improving the bridging defects between the source/drain epitaxial layer and the gate according to claim 1, wherein the sidewalls are formed by adopting a deposition process.

8. The method for improving the bridging defects between the source/drain epitaxial layer and the gate according to claim 1, wherein the hard mask layer is formed by adopting a deposition process.

9. The method for improving the bridging defects between the source/drain epitaxial layer and the gate according to claim 1, wherein the embedded trench is formed by adopting an etching process.

10. The method for improving the bridging defects between the source/drain epitaxial layer and the gate according to claim 1, wherein the embedded trench comprises a Σ-shape.

* * * * *